United States Patent
Lev et al.

(10) Patent No.: US 8,406,009 B2
(45) Date of Patent: Mar. 26, 2013

(54) PRINTED CIRCUIT BOARD (PCB) FLEXIBLY CONNECTED TO A DEVICE CHASSIS

(75) Inventors: Jeffrey A. Lev, Tomball, TX (US);
Steven S. Homer, Tomball, TX (US);
Earl W. Moore, Cypress, TX (US);
Mark H. Ruch, The Woodlands, TX (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 79 days.

(21) Appl. No.: 12/863,479

(22) PCT Filed: Jan. 30, 2008

(86) PCT No.: PCT/US2008/052474
§ 371 (c)(1),
(2), (4) Date: Jul. 19, 2010

(87) PCT Pub. No.: WO2009/096960
PCT Pub. Date: Aug. 6, 2009

(65) Prior Publication Data
US 2010/0284143 A1    Nov. 11, 2010

(51) Int. Cl.
*H05K 7/02* (2006.01)
(52) U.S. Cl. ........ 361/807; 361/742; 361/758; 361/804; 361/759; 174/268; 174/138 E; 174/138 G
(58) Field of Classification Search ............. 361/679.55, 361/807, 742, 758, 804, 75, 9; 174/268, 174/138 E, 138 G
See application file for complete search history.

(56) References Cited

U.S. PATENT DOCUMENTS

| | | | | |
|---|---|---|---|---|
| 5,736,679 | A * | 4/1998 | Kresge et al. | 174/250 |
| 5,761,031 | A * | 6/1998 | Ajmani | 361/679.34 |
| 5,959,844 | A * | 9/1999 | Simon et al. | 361/759 |
| 6,313,984 | B1 * | 11/2001 | Furay | 361/679.31 |
| 6,751,102 | B1 * | 6/2004 | Chen | 361/758 |
| 2003/0030997 | A1 * | 2/2003 | Mizusaki | 361/758 |
| 2004/0140821 | A1 | 7/2004 | Lee | |
| 2004/0196637 | A1 * | 10/2004 | Le et al. | 361/758 |
| 2004/0218375 | A1 | 11/2004 | Fronk | |
| 2006/0146507 | A1 * | 7/2006 | Lee | 361/758 |
| 2007/0133187 | A1 * | 6/2007 | Lin et al. | 361/799 |
| 2008/0117614 | A1 * | 5/2008 | Qin et al. | 361/807 |

FOREIGN PATENT DOCUMENTS

| KR | 20-1999-0010934 | 3/1999 |
|---|---|---|
| KR | 10-2007-0051106 | 5/2007 |

OTHER PUBLICATIONS

JP2002-158407 English translation.*
International Search Report and Written Opinion of the International Searching Authority dated Sep. 29, 2008, pp. 10.

* cited by examiner

*Primary Examiner* — Tuan T Dinh
*Assistant Examiner* — Steven Sawyer

(57) ABSTRACT

An electronic device is provided, the electronic device includes a printed circuit board (PCB) having a mounting point. The computer system also includes a chassis having a mounting post. The mounting point and the mounting post are flexibly connected.

14 Claims, 4 Drawing Sheets

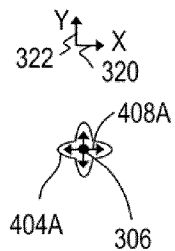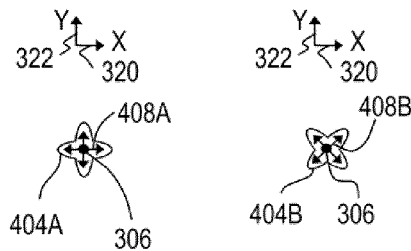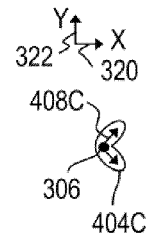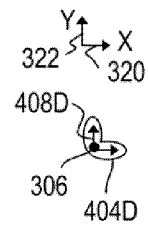
FIG. 4A  FIG. 4B  FIG. 4C  FIG. 4D
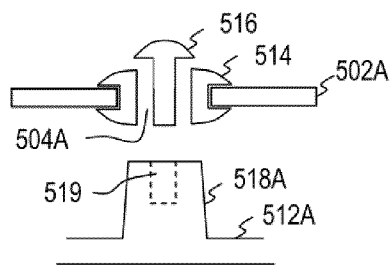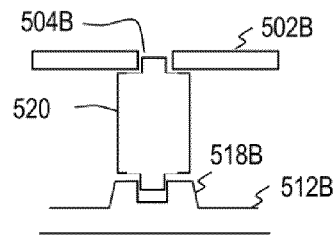
FIG. 5A  FIG. 5B
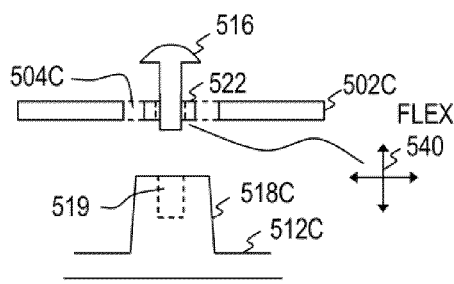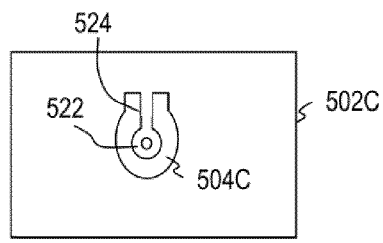
FIG. 5C  FIG. 5D

PRINTED CIRCUIT BOARD (PCB) FLEXIBLY CONNECTED TO A DEVICE CHASSIS

BACKGROUND

The printed circuit board (PCB) of an electronic device (e.g., a laptop) is subject to various types of stress. For example, stress to the PCB may occur during assembly of the electronic device, during handling or transportation of the electronic device, during thermal cycles of the electronic device, and during a drop or otherwise mishandling the electronic device. Stress to the PCB may result in damage, such as cracked solder joints or other open circuits, which causes the electronic device to no longer function properly. The likelihood of stress is particularly high for some portable electronic devices (e.g., a laptop computer where a thin chassis is handled often). Eliminating or reducing stress to the PCB of an electronic device is desirable.

BRIEF DESCRIPTION OF THE DRAWINGS

For a detailed description of exemplary embodiments of the invention, reference will now be made to the accompanying drawings in which:

FIGS. 4A-4D illustrate various PCB mounting points in accordance with alternative embodiments;

FIG. 5A illustrates a cross-sectional view of a PCB being mounted to an electronic device chassis in accordance with embodiments;

FIG. 5B illustrates another cross-sectional view of a PCB being mounted to an electronic device chassis in accordance with alternative embodiments;

FIG. 5C illustrates yet another cross-sectional view of a PCB being mounted to an electronic device chassis in accordance with alternative embodiments;

FIG. 5D illustrates a top view of the PCB of FIG. 4C in accordance with embodiments.

NOTATION AND NOMENCLATURE

Figure 1:
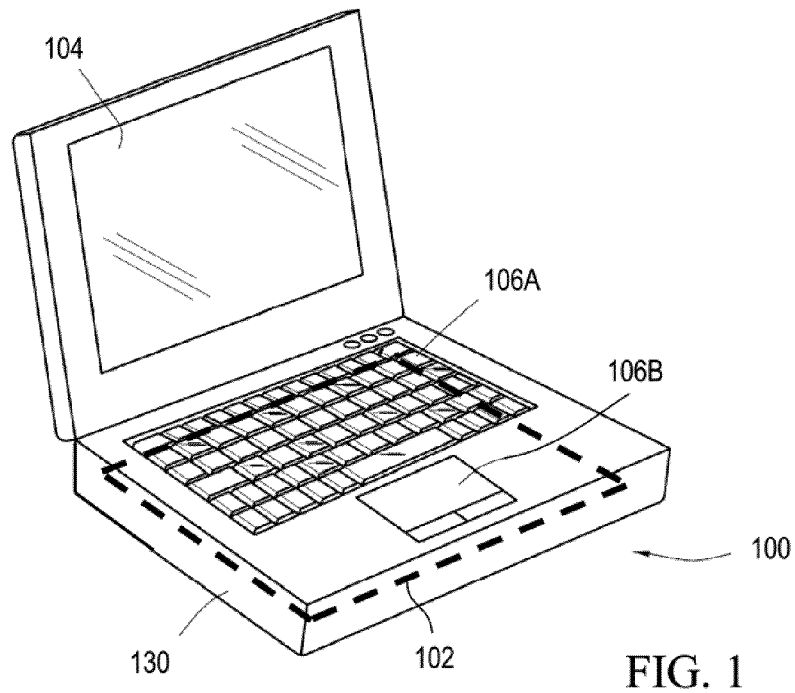
FIG. 1 illustrates an electronic device in accordance with embodiments.

Certain terms are used throughout the following description and claims to refer to particular system components. As one skilled in the art will appreciate, computer companies may refer to a component by different names. This document does not intend to distinguish between components that differ in name but not function. In the following discussion and in the claims, the terms "including" and "comprising" are used in an open-ended fashion, and thus should be interpreted to mean "including, but not limited to . . . ." Also, the term "couple" or "couples" is intended to mean either an indirect, direct, optical or wireless electrical connection. Thus, if a first device couples to a second device, that connection may be through a direct electrical connection, through an indirect electrical connection via other devices and connections, through an optical electrical connection, or through a wireless electrical connection.

DETAILED DESCRIPTION

The following discussion is directed to various embodiments of the invention. Although one or more of these embodiments may be preferred, the embodiments disclosed should not be interpreted, or otherwise used, as limiting the scope of the disclosure, including the claims. In addition, one skilled in the art will understand that the following description has broad application, and the discussion of any embodiment is meant only to be exemplary of that embodiment, and not intended to intimate that the scope of the disclosure, including the claims, is limited to that embodiment.

As disclosed herein, embodiments provide stress reduction for the printed circuit board (PCB) of an electronic device. In at least some embodiments, a flexible connection is provided between the device chassis and the PCB. For example, at least one mounting point of the PCB can be flexibly connected to a corresponding mounting post of the device chassis. As used herein, a "flexible connection" has more flexibility than the PCB and/or provides a PCB mounting point that enables movement (e.g., one-dimensional, two-dimensional, or three-dimensional) when fastened to a chassis post. As used herein, a "rigid connection" has less flexibility than the PCB and/or provides a PCB mounting point that limits movement when fastened to a chassis post. As used herein, a "mounting point" refers to any PCB projection and/or orifice used to connect a PCB to a device chassis. As used herein, a "mounting post" refers to any chassis projection and/or orifice used to connect a chassis to a PCB.

The flexible connection between a PCB and a device chassis can be achieved in various ways. In some embodiments, a flexible PCB mounting point of the PCB is connected to a rigid mounting post of the device chassis. Additionally or alternatively, a rigid PCB mounting point of the PCB is connected to a flexible mounting post of the device chassis. Additionally or alternatively, a flexible PCB mounting point is connected to a flexible mounting post of the device chassis using a rigid or flexible material. Additionally or alternatively, a rigid PCB mounting point is connected to a rigid mounting post of the device chassis using a flexible material. Additionally or alternatively, the fastener connecting a PCB mounting point and a chassis mounting post enables movement in one, two or three dimensions.

A flexible connection between a PCB and a device chassis reduces the stress applied to the PCB during a stress event. As used herein, a "stress event" refers to an event that potentially causes damage to the PCB. Examples of stress events include, but are not limited to, assembling the electronic device, handling the electronic device, transporting the electronic device, thermal cycles of the electronic device, dropping the electronic device, or other events that potentially cause damage due to stress applied to the PCB.

Although preventing stress to PCBs is generally desirable, certain areas of a PCB may be more sensitive to stress than other areas. For example, areas where electronic chips are soldered to a PCB may be sensitive to stress. As an example, the solder joints connecting a ball-grid array (BGA) chip to a PCB may be sensitive to PCB stress. Similarly, the connectivity of pin/plug connectors that are part of (or are attached to) a PCB may be sensitive to movement caused by PCB stress. Embodiments, such as those described herein, eliminate stress or re-direct stress from sensitive areas of a PCB to less sensitive areas of the PCB.

FIG. 1 illustrates an electronic device 100 in accordance with embodiments. As shown in FIG. 1, the electronic device 100 comprises a display 104 and user input devices 106A (e.g., a keyboard) and 106B (e.g., a touchpad). The electronic device 100 also comprises a chassis 130 that houses a PCB 102 (e.g., shown in dashed lines) and other components (not shown). The PCB 102 provides a base for interconnecting semiconductor components, input/output connectors and/or other electronic components and may be representative of a motherboard. At least some of the electronic components inside the electronic device 100 are soldered to the PCB 102. In accordance with embodiments, the PCB 102 is flexibly connected to the device chassis 130 in a manner that reduces stress to the PCB 102 during a stress event. Reducing stress to the PCB 102 helps to prevent damage, such as cracked solder joints or other open circuits, which may cause the electronic device 100 to no longer function properly.

Although the electronic device 100 is representative of a laptop computer, alternative embodiments may vary with respect to size, shape, computing capacity and/or features. Many other electronic devices now existing or later developed may benefit from providing a flexible connection between the device chassis 130 and the PCB 102. Examples of such electronic devices include, but are not limited to, laptop computers, desktop computers, DVD players, CD players, game systems, personal digital assistants (PDAs), cellular phones, smart phones, GPS devices, user input devices (mouse, keyboard) or other electronic devices having PCBs.

Figure 2A:
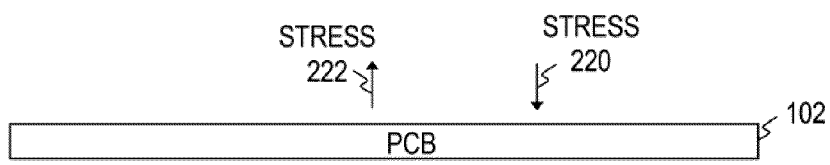
FIG. 2A illustrates a cross-sectional view of a printed circuit board (PCB) to illustrates stress orthogonally applied to the PCB.

FIG. 2A illustrates a cross-sectional view of a PCB 102 to illustrate stress orthogonally applied to the PCB. As shown in FIG. 2A, stresses that follow the stress direction arrows 220 and 222 may be applied to the PCB 102 due to a stress event. The stress direction arrows 220 and 222 represent stresses that are perpendicular to the "face" (i.e., the side where components are mounted) of the PCB 102.

Figure 2B:
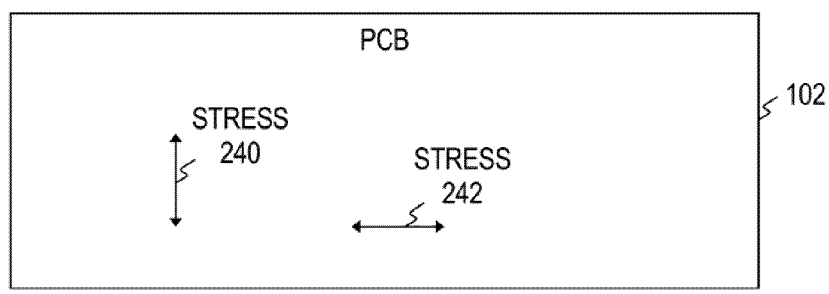
FIG. 2B illustrates a top view of a PCB to illustrate stress transversely applied to the PCB.

FIG. 2B illustrates a cross-sectional view of a PCB 102 to illustrate stress transversally applied to the PCB 102. As shown in FIG. 2B, stresses that follow the stress direction arrows 240 and 242 may be applied to the PCB 102 due to a stress event. The stress direction arrows 240 and 242 represent stresses that are parallel to the face of the PCB 102 (i.e., the side where components are mounted to the PCB 102) and can be in directions other than the orthogonal directions illustrated by arrows 120, 242. In at least some embodiments, some stresses to the PCB 102 represent a combination of forces which are perpendicular (orthogonal) and/or parallel (transversal) to the face of the PCB 102. In other words, forces applied to the PCB 102 may represent some combination of the stress direction arrows 220, 222, 240 and 242. Also, stresses to the PCB 102 may vary across different areas of the PCB 102 and may vary at different times.

Figure 3A:
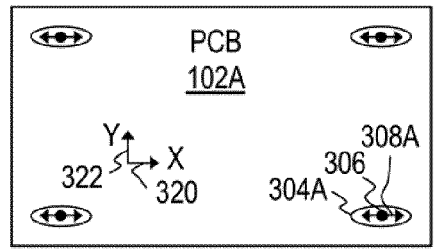
FIGS. 3A-3H illustrate various PCB top views to show mounting point configurations in accordance with embodiments.

In accordance with some embodiments, the PCB 102 has mounting points that enable the PCB to connect to a device chassis. FIGS. 3A-3H illustrate various PCB top views to show mounting point configurations in accordance with embodiments. In FIG. 3A, the PCB 102A has a mounting point 304A near each corner. As shown, each mounting point 304A is general oval (length is longer than width) and is shaped to enable a corresponding chassis mounting post 306 to slide in a predetermined direction 308A parallel to an X-axis 320 indicated for the PCB 102A. As shown, each mounting point 304A enables a corresponding chassis mounting post 306 to move back and forth towards opposite sides of the PCB 102A.

Figure 3E:
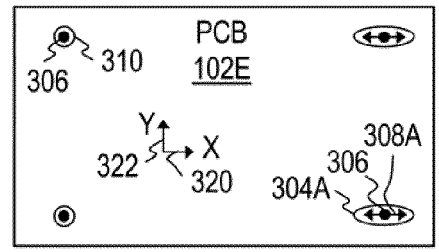
Figure 3B:
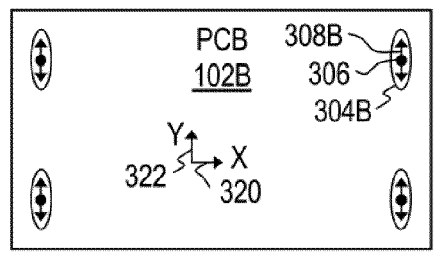

In FIG. 3B, a PCB 102B has a mounting point 304B near each corner. Each mounting point 304B is shaped to enable a corresponding chassis mounting post 306 to slide in a predetermined direction 308B parallel to a Y-axis 322 indicated for the PCB 102B. As shown, each mounting point 304B enables a corresponding chassis mounting post 306 to move back and forth towards opposite sides of the PCB 102B.

Figure 3F:
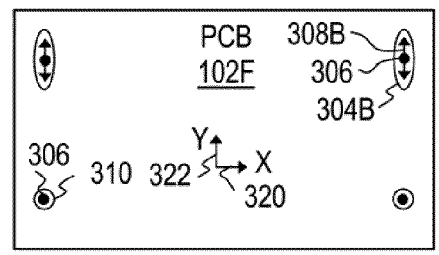
Figure 3C:
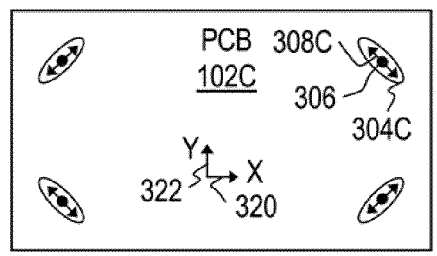

In FIG. 3C, a PCB 102C has a mounting point 304C near each corner. Each mounting point 304C is shaped to enable a corresponding chassis mounting post 306 to slide in a predetermined direction 308C having an X-axis component and a Y-axis component indicated for the PCB 102C. As shown, each mounting point 304C enables a corresponding chassis mounting post 306 to move back and forth towards adjacent sides of the PCB 102C.

Figure 3G:
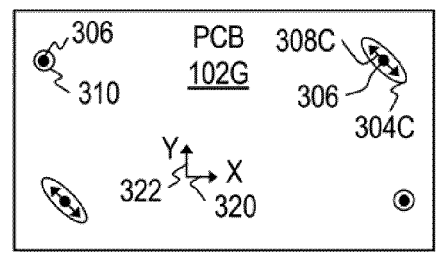
Figure 3D:
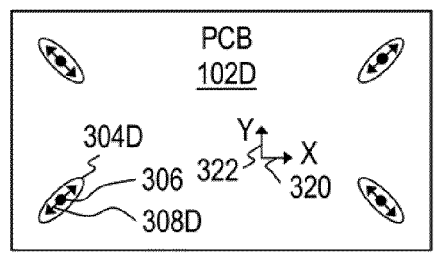

In FIG. 3D, a PCB 102D has a mounting point 304D near each corner. Each mounting point 304D is shaped to enable a corresponding chassis mounting post 306 to slide in a predetermined direction 308D having an X-axis component and a Y-axis component indicated for the PCB 102D. As shown, each mounting point 304D enables a corresponding chassis mounting post 306 to move towards and away from a nearest corner of the PCB 102D.

In FIG. 3E, a PCB 102E has mounting points 304A near two corners and rigid mounting points 310 near two corners. Each mounting point 304A is shaped to enable a corresponding chassis mounting post 306 to slide in a predetermined direction 308A parallel to an X-axis 320 indicated for the PCB 102E. As shown, each mounting point 304A enables a corresponding chassis mounting post 306 to move back and forth towards opposite sides of the PCB 102E. Meanwhile, the rigid mounting points 310 prevent movement of their corresponding chassis mounting posts 306. The PCB 102E thus enables rigid chassis connections at some mounting points (e.g., the rigid mounting points 310) and flexible chassis connections at other PCB mounting points (e.g., the mounting points 304A).

In FIG. 3F, a PCB 102F has mounting points 304B near two corners and rigid mounting points 310 near two corners. Each mounting point 304B is shaped to enable a corresponding chassis mounting post 306 to slide in a predetermined direction 308B parallel to a Y-axis 320 indicated for the PCB 102F. As shown, each mounting point 304B enables a corresponding chassis mounting post 306 to move back and forth towards opposite sides of the PCB 102F. Meanwhile, the rigid mounting points 310 prevent movement of their corresponding chassis mounting posts 306. The PCB 102F thus enables rigid chassis connections at some PCB mounting points (e.g., the rigid mounting points 310) and flexible chassis connections at other PCB mounting points (e.g., the mounting points 304B).

In FIG. 3G, a PCB 102G has mounting points 304C near two corners and rigid mounting points 310 near two corners. Each mounting point 304C is shaped to enable a corresponding chassis mounting post 306 to slide in a predetermined direction 308C having an X-axis component and a Y-axis component indicated for the PCB 102G. As shown, each mounting point 304C enables a corresponding chassis mounting post 306 to move back and forth towards two adjacent sides of the PCB 102G. Meanwhile, the rigid mounting points 310 prevent movement of their corresponding chassis mounting posts 306. The PCB 102G thus enables rigid chassis connections at some PCB mounting points (e.g., the rigid mounting points 310) and flexible connections at other PCB mounting points (e.g., the mounting points 304C).

Figure 3H:
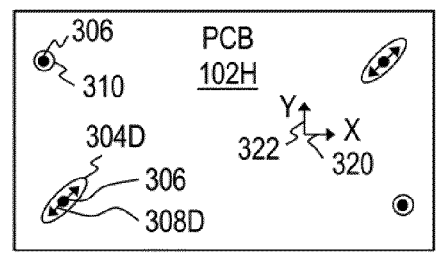

In FIG. 3H, a PCB 102H has mounting points 304D near two corners and rigid mounting points 310 near two corners. Each mounting point 304D is shaped to enable a corresponding chassis mounting post 306 to slide in a predetermined direction 308D having an X-axis component and a Y-axis component indicated for the PCB 102H. As shown, each mounting point 304D enables a corresponding chassis mounting post 306 to move towards and away from a nearest corner of the PCB 102H. Meanwhile, the rigid mounting points 310 prevent movement of their corresponding chassis mounting posts 306. The PCB 102H thus enables rigid chassis connections at some PCB mounting points (e.g., the rigid mounting points 310) and flexible chassis connections at other mounting points (e.g., the mounting points 304D).

The embodiments of FIGS. 3A-3H are illustrative only and are not intended to limit embodiments to a particular mounting point shape or configuration. Rather, FIGS. 3A-3H illustrate that embodiments may differ with respect to the direction and amount of flexibility. Also, embodiments may combine the various mounting point configurations for a single PCB as desired. In other words, each corner or side (or other areas) of a PCB can be treated separately with regard to stress reduction. As an example, a single PCB could have a mounting point 304A in a first corner, a mounting point 304B in a second corner, a mounting point 304C in a third corner, and a mounting point 304D in a fourth corner. Other angles for mounting point configurations are possible as well and may be selected based on a stress direction determination or other factors.

The location of the rigid mounting points 310 can be selected as desired to provide a rigid connection between a PCB and a device chassis. Although FIGS. 3E-3H illustrate embodiments having two rigid mounting points 310, additional or fewer rigid mounting points 310 can be provided as desired. For example, there may be certain areas of a PCB where a rigid connection to the device chassis is desired and other areas of the PCB where a flexible connection to the device chassis is desired. The rigid mounting points 310 can be used, for example, near sensitive areas of a PCB to re-direct stress to less sensitive areas of the PCB. For example, rigid mounting points 310 can be implemented in areas where ball-grid array (BGA) chips are soldered to a PCB or where pin/plug connectors are utilized to re-direct stress to other areas of the PCB.

Although FIGS. 3A-3H illustrate embodiments having mounting points 304A-304D that are oval or elliptical in shape, other shapes (e.g., rectangular) are possible as well. The dimension of the mounting points may vary (e.g., depending on fastener size). Although not required, some mounting points have a length/width ratio greater than 2. The mounting point shape should enable a corresponding mounting post of the device chassis to slide in a predetermined direction or directions while still connected to the mounting point with a fastener (e.g., a screw). The predetermined directions 308A, 308B, 308C and 308D are representative of one-dimensional stress relief. Although one-dimensional stress and stress relief is possible, those of skill in the art should recognize that stress can occur in one, two or three dimensions. For example, as understood by those of skill in the art, stress at one mounting point location may cause some movement (in the x, y and/or z directions) at other mounting point locations or may cause stress to the PCB (bending/stretching) between mounting points. The various descriptions of stress directions and stress relief have been simplified by focusing on the x, y directions to facilitate the discussion and not to limit embodiments in any way.

Although FIGS. 3A-3H illustrate embodiments having a mounting point near each PCB corner, additional or fewer mounting points can be provided as desired. Further, the mounting points are not limited to PCB corners and may be in other locations. In other words, embodiments may vary with respect to the number and location of mounting points.

Regardless of the number and location of the mounting points for a PCB, the chassis of electronic device embodiments should provide corresponding mounting posts. In at least some embodiments, connecting the mounting points of a PCB to corresponding mounting posts of a device chassis involves fasteners such as screws. In such embodiments, where a flexible connection is desired, this flexible connection should exist between the PCB mounting point and the corresponding chassis mounting post after the fastener is properly situated. In various embodiments, the movement of mounting points in the z-direction (sliding along the axis of the fastener) is permitted or is limited as desired.

FIGS. 4A-4D illustrate various alternative PCB mounting points in accordance with embodiments. In FIG. 4A, the mounting point 404A is shaped to enable a corresponding chassis mounting post 306 to slide in multiple directions 408A parallel to the X-axis 320 and the Y-axis 322 as shown. In FIG. 4B, the mounting point 404B is shaped to enable a corresponding chassis mounting post 306 to slide in multiple directions 408B diagonal to the X-axis 320 and the Y-axis 322 as shown. In other words, the directions 408B have an X-axis component and a Y-axis component. In FIG. 4C, the mounting point 404C is shaped to limit movement of a corresponding chassis mounting post 306 in some directions and to enable the corresponding chassis mounting post 306 to slide in multiple directions 408C diagonal to the X-axis 320 and the Y-axis 322. In FIG. 4D, the mounting point 404D is shaped to limit movement of a corresponding chassis mounting post 306 in some directions and to enable the corresponding chassis mounting post 306 to slide in multiple directions 408C parallel to the X-axis 320 and the Y-axis 322 as shown.

The mounting point embodiments of FIGS. 4A-4D are illustrative only and are not intended to limit embodiments to a particular mounting point shape. Rather, FIGS. 4A-4D illustrate that mounting points may differ with respect to the directions supported and the amount of flexibility. Other angles for mounting points are possible as well and may be selected based on a stress direction determination or other factors.

Although FIGS. 4A-4D illustrate mounting point embodiments having a combination of oval or elliptical shapes, other shapes (e.g., rectangular) are possible as well. The dimension of the mounting points may vary (e.g., depending on fastener size). In general, some mounting points use combinations of elongated shapes (e.g., two or more overlapping/intersecting ovals). The mounting point shape should enable a corresponding mounting post of the device chassis to slide in a predetermined direction or directions while still connected to the mounting point with a fastener (e.g., a screw). The predetermined directions 408A, 408B, 408C and 408D are representative of two-dimensional stress relief. Although two-dimensional stress and stress relief is possible, those of skill in the art should recognize that stress can occur in one, two or three dimensions. For example, as understood by those of skill in the art, stress at one mounting point location may cause some movement (in the x, y and/or z directions) at other mounting point locations or may cause stress to the PCB (bending/stretching) between mounting points. The various descriptions of stress directions and stress relief have been simplified by focusing on the x, y directions to facilitate the discussion and not to limit embodiments in any way.

FIGS. 3A-3H and 4A-4D illustrates examples in which a direction-specific flexible connection between a PCB and a device chassis is achieved based on a mounting point shape. Other flexible connections are possible as well as described in FIGS. 5A-5D.

FIG. 5A illustrates a cross-sectional view of a PCB 502A being mounted to an electronic device chassis 512A in accordance with embodiments. In FIG. 5A, a mounting point 504A of the PCB 502A is aligned with a corresponding mounting post 518A of the device chassis 512A. In at least some embodiments, a rubber grommet 514 or other suitably flexible material is fitted around the mounting point 504A. To connect the PCB 502A to the corresponding mounting post 518A, a fastener 516 is inserted through the mounting point 504A and into an orifice 519 of the mounting post 518A. The fastener 516 is tightened as desired with the grommet 514 providing three-dimensional stress relief for the PCB 502A if a stress event occurs.

FIG. 5B illustrates a cross-sectional view of a PCB 502B being mounted to an electronic device chassis 512B in accordance with alternative embodiments. In FIG. 5B, a mounting point 504B of the PCB 502B is aligned with a corresponding mounting post 518B of the device chassis 512B. A flexible connector 520 (e.g., a rubber post) is fitted between the mounting point 504B and the mounting post 518B. A fastener in addition to the flexible connector 520 may or may not be used. In either case, the flexible connector 520 provides three-dimensional stress relief for the PCB 502B if a stress event occurs.

FIG. 5C illustrates a cross-sectional view of a PCB 502C being mounted to an electronic device chassis 512C in accordance with alternative embodiments. In FIG. 5C, a mounting point platform (or island) 522 is provided. In at least some embodiments, forming the mounting point platform 522 involves cutting an open space 504C into the PCB 502C around most of the mounting point platform 522. The bridge 524 connecting the platform or island 522 to the PCB 502C enables the mounting point platform 522 to flex in certain directions 540 into the open space 504C. To connect the PCB 502C to the corresponding mounting post 518C, a fastener 516 is inserted through the mounting point platform 522 and into an orifice 519 of the mounting post 518C. The fastener 516 is tightened as desired with the mounting point platform 522 providing stress relief for the PCB 502C if a stress event occurs. In other words, during a stress event, the mounting point platform 522 moves and eliminates or reduces the force applied to the remainder of the PCB 502C.

FIG. 5D illustrates a top view of the PCB 502C of FIG. 5C in accordance with embodiments. As shown, the mounting point platform 522 extends into the open space 504C which has been cut out of the PCB 502C. In some embodiments, the open space 504C forms a horseshoe shape although other shapes are possible. Regardless of shape, the open space 504C should allow the mounting point platform 522 to flex in certain directions 540 as desired to reduce stress to the remainder of the PCB 502C.

Figure 6:
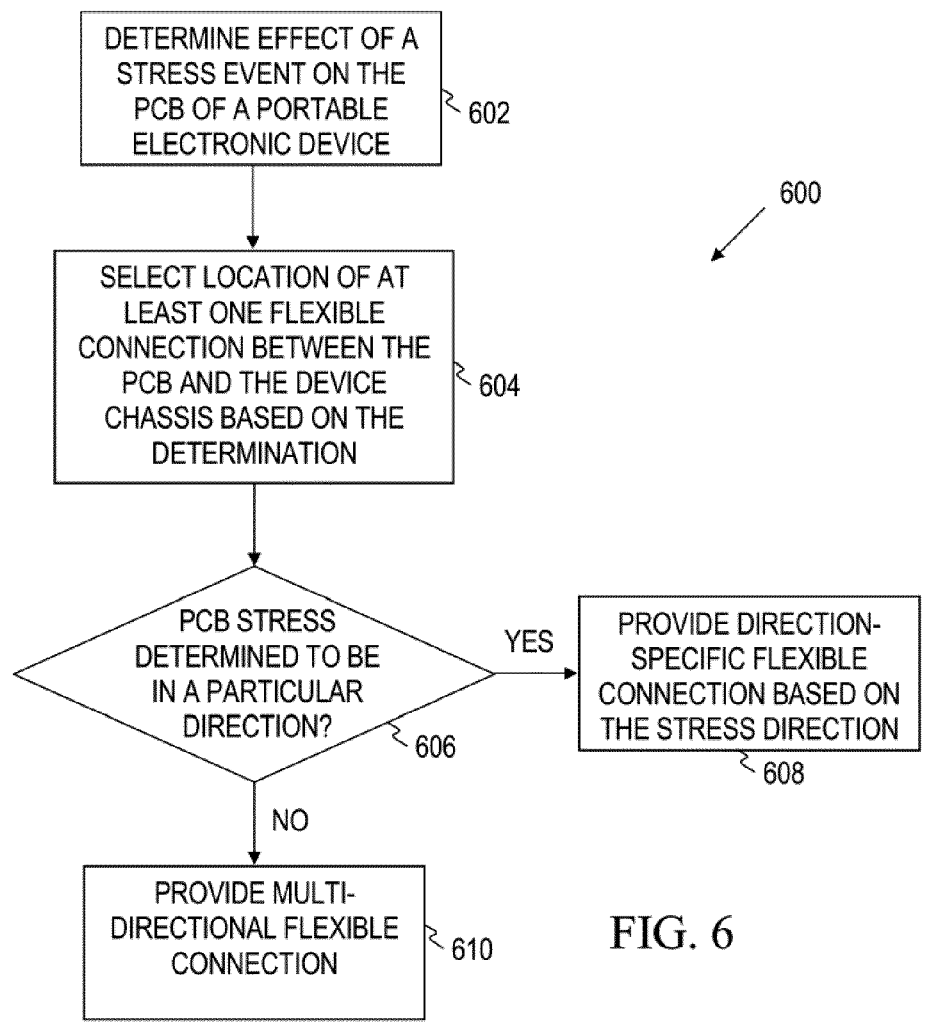
FIG. 6 illustrates a method in accordance with embodiments.

FIG. 6 illustrates a method 600 in accordance with embodiments. The method provides at least one flexible connection between a PCB and an electronic device chassis. As shown, the method 600 comprises determining an effect of a stress event on the PCB of an electronic device (block 602). Examples of stress events include, but are not limited to, assembling the electronic device, handling the electronic device, transporting the electronic device, thermal cycles of the electronic device, dropping the electronic device, or other events that potentially cause damage to the PCB. To determine the effect of stress events, a manufacturer may subject electronic devices to various stress tests.

At block 604, the location of at least one flexible connection between the PCB and the device chassis is selected. If PCB stress is determined to be in a particular direction (determination block 606), a direction-specific flexible connection based on the stress direction or directions is provided between the PCB and the device chassis (block 608). If PCB stress is not determined to be in a particular direction (determination block 606), a multi-directional flexible connection is provided between the PCB and the device chassis (block 610). Again, an electronic device manufacturer is able to perform various stress tests to determine where stress relief is needed.

In at least some embodiments, the method 600 may include fewer or additional steps. For example, either direction-specific flexible connections or multi-directional flexible connections can be provided regardless of whether a stress direction is determined. Also, steps such as providing at least one rigid connection between the PCB and the device chassis (e.g., rigidly connecting at least one mounting point of the PCB to a corresponding mounting post of the electronic device chassis), fitting at least one mounting point of the PCB with a grommet, fitting a flexible post between a PCB mounting point and chassis mounting post and/or cutting a flexible mounting point platform into a PCB could be added to the method 600.

In general, the method 600 provides at least one flexible connection between a PCB and an electronic device chassis. The flexible connection may be one-dimensional, two-dimensional or three-dimensional. The flexible connection may involve connecting a flexible PCB mounting point to a rigid chassis mounting post, connecting a rigid PCB mounting point to a flexible chassis mounting post, connecting a flexible PCB mounting point to a flexible chassis mounting post or connecting a rigid PCB mounting point to a rigid chassis mounting post with a flexible material.

The above discussion is meant to be illustrative of the principles and various embodiments of the present invention. Numerous variations and modifications will become apparent to those skilled in the art once the above disclosure is fully appreciated. Those It is intended that the following claims be interpreted to embrace all such variations and modifications.

What is claimed is:

1. An electronic device, comprising:
    a printed circuit board (PCB) including pairs of adjacent sides defining a plurality of corners, and said PCB comprises a mounting point near each corner; and
    a chassis comprising a plurality of mounting posts to correspond to each mounting point,
    wherein each mounting point and corresponding mounting post are flexibly connected to protect the PCB;
    wherein each mounting point including an elongated shape that comprises a long axis that extends between the adjacent sides defining the corner near which the mounting point resides, said mounting point enabling the mounting post to slide back and forth along the long axis between the adjacent sides; and
    wherein the elongate shape of at least one mounting point extends in a different direction than the elongate shape of at least one other mounting point.

2. The electronic device of claim 1 wherein the mounting point is shaped to enable the mounting post to slide in a predetermined direction while connected.

3. The electronic device of claim 1 wherein the PCB includes a plurality of mounting points and the chassis includes corresponding mounting posts and wherein different direction-specific flexible connections are provided for at least two mounting points and corresponding mounting posts.

4. The electronic device of claim 1 further comprising at least one rigid connection between the PCB and the chassis.

5. The electronic device of claim 1 wherein each mounting point is fitted with a grommet.

6. The electronic device of claim 1 wherein each mounting post comprises a flexible material.

7. The electronic device of claim 1 further comprising a fastener that attaches each mounting point to a corresponding mounting post, wherein the fastener enables the PCB to tilt.

8. The electronic device of claim 1 wherein a position and orientation of each mounting point is selected based on a predetermined stress event.

9. The electronic device of claim 1 wherein the electronic device is a laptop computer.

10. The electronic device of claim 2 wherein the predetermined direction is one-dimensional.

11. The electronic device of claim 2 wherein the predetermined direction is two-dimensional.

12. The electronic device of claim 4 wherein the at least one rigid connection is located near an electronic chip to re-direct PCB stress away from solder joints of the electronic chip.

13. The electronic device of claim 12 wherein the at least one rigid connection is located near a pin/plug connector to re-direct PCB stress away from the pin/plug connector.

14. An electronic device, comprising:
a printed circuit board (PCB) including four sides defining four corners;
a mounting point near each of the four corners, each mounting point including an elongate shape comprising a longitudinal axis that extends between adjacent sides defining the corner near which the mounting point resides, and wherein the longitudinal axes of one pair of diagonally opposing mounting points being parallel but oriented generally orthogonally to the longitudinal axes of the other pair of diagonally opposing mounting points; and
a chassis comprising a plurality of mounting posts to correspond to each of the mounting points;
wherein each mounting point and corresponding mounting post are flexibly connected to protect the PCB.

* * * * *